(12) United States Patent
Chiueh et al.

(10) Patent No.: US 6,674,824 B1
(45) Date of Patent: Jan. 6, 2004

(54) METHOD AND CIRCUITRY FOR CONTROLLING A PHASE-LOCKED LOOP BY ANALOG AND DIGITAL SIGNALS

(75) Inventors: Tzi-Dar Chiueh, Taipei (TW); Jen-Shi Wu, Taipei (TW); Jin-Bin Yang, Changhua (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/339,704

(22) Filed: Jun. 24, 1999

(30) Foreign Application Priority Data

Aug. 18, 1998 (TW) ........................................ 87113534 A (51) Int. Cl.[7] ................................................ H04D 3/24
(52) U.S. Cl. ........................ 375/376; 375/373; 375/374; 375/375
(58) Field of Search ................................ 375/375, 376, 375/373, 374; 331/11, 18, 1 A, 17; 327/146, 147, 155, 156, 162

(56) References Cited

U.S. PATENT DOCUMENTS 5,371,425 A * 12/1994 Rogers ........................ 331/10
5,487,093 A * 1/1996 Adresen et al. ............. 375/376
5,978,425 A * 11/1999 Takla ........................... 375/376
6,028,460 A * 2/2000 McCollum et al. ........... 331/11
6,064,272 A * 5/2000 Rhee ............................ 331/18
6,242,956 B1 * 6/2001 McCollough et al. ........ 327/154

* cited by examiner

Primary Examiner—Tesfaldet Bocure
Assistant Examiner—Demetria Williams
(74) Attorney, Agent, or Firm—Michael, Best & Friedrich LLC (57) ABSTRACT

A mixed-signal-controlled phase-locked loop is provided. This loop includes a mixed-signal-controlled oscillator circuit for generating an oscillating signal having an oscillating frequency and a phase in response to a digital control signal and an analog control signal, a phase-frequency detector circuit electrically connected to the mixed-signal-controlled oscillator circuit, detecting the phase and the oscillating frequency of the oscillating signal and comparing the phase and the oscillating frequency with those of a reference signal to generate an error signal after the phase and oscillating frequency are detected, and a mixed-control-signal-producing circuit electrically connected to the mixed-signal-controlled oscillator circuit and the phase-frequency detector circuit for receiving the error signal to output the analog control signal and the digital control signal to the mixed-signal-controlled oscillator circuit.

6 Claims, 12 Drawing Sheets

METHOD AND CIRCUITRY FOR CONTROLLING A PHASE-LOCKED LOOP BY ANALOG AND DIGITAL SIGNALS

FIELD OF THE INVENTION

The present invention relates to a mixed-signal-controlled phase-locked loop (PLL) and a method for controlling a phase-locked loop by both analog and digital signals.

BACKGROUND OF THE INVENTION

The phase-locked loops (PLL) have been widely used in high-speed digital systems, disk storage systems, and communication systems. The main functions of the PLL include the time-pulse shifting modulation, the internal time-pulse frequency multiplication, the carrier wave synchronization, and the timing synchronization. As an example, the frequency synthesizer is designed according to the function of the frequency multiplication of the PLL.

Conventionally, the frequency synthesizer is constructed by the use of an analog PLL. The analog PLL includes a voltage control oscillator (VCO) to generate a periodic signal synchronized to a particular reference signal. The frequency of the periodic signal is controlled by an analog voltage, which is modulated through a feedback loop. Generally, the feedback loop includes a phase frequency detector (PFD) and a loop filter. The PFD is used for generating an "UP" or "DN" pulse which represents the polarity of the phase difference between the periodic signal and the reference signal. The loop filter including a charge pump circuit and a resistance-capacitance (RC) filter is used for integrating the pulse generated from the PFD to output a control voltage. This control voltage generated from the loop filter is fed back to control the frequency of the periodic signal generated from the VCO. The control of the control voltage over the frequency of the periodic signal is continuous and, therefore, the analog PLL can provide a good frequency resolution.

However, the bandwidth of the analog PLL has to be carefully designed to let the signal generated from the PLL have a proper damping characteristic and a low phase noise. If the gain of the loop is too large, the analog PLL will be unstable and the phase will jitter. If the gain of the loop is too small, the phase-locked loop will not have a capacity for adjusting the phase shifting generated from the voltage and temperature changes. The bandwidth of the analog phase-locked loop usually is one tenth of the frequency of the reference signal. In order to obtain both a fast stability and a sufficient phase-shifting endurance, an independent frequency-locked loop (FLL) and an independent analog PLL are designed to function together with one or two VCO.

The all-digital PLL includes a digital controlled oscillator (DCO) and a digital circuit for detecting the frequency and phase. Because a special algorithm is used to search for the digital control word in the digital controlled oscillator, the digital phase-locked loop can capture the frequency in only 50 time-pulse cycles. Therefore, the speed of the all-digital PLL in capturing frequency is much faster than that of the analog PLL. Although the all-digital PLL is programmable, it still has some problems. Namely, the frequency resolution is not as good as the analog PLL and the all-digital PLL is sometimes not suitable for high-frequency uses.

The analog PLL has a better frequency resolution but the speed for capturing the frequency is slow. The all-digital PLL is programmable and has a high speed for capturing the frequency but the frequency resolution is not good enough to be utilized as a frequency synthesizer. It is therefore attempted by the applicant to deal with the above situation encountered with the prior art.

SUMMARY OF THE INVENTION

An objective of the present invention is to provide a mixed-signal-controlled phase-locked loop and a method for controlling the same by both the analog and the digital control signals.

Another objective of the present invention is to provide a mixed-signal-controlled phase-locked loop and a method of controlling the same at a fast frequency acquisition speed.

A further objective of the present invention is to provide a mixed-signal-controlled phase-locked loop with a low phase noise and a high frequency resolution.

According to the first aspect of the present invention, a mixed-signal-controlled phase-locked loop includes a mixed-signal-controlled oscillator circuit for generating an oscillating signal having an oscillating frequency and a phase in response to a digital control signal and an analog control signal, a phase-frequency detector circuit electrically connected to the mixed-signal-controlled oscillator circuit, detecting the phase and the oscillating frequency of the oscillating signal and comparing the phase and the oscillating frequency with those of a reference signal to generate an error signal after the phase and oscillating frequency are detected, and a mixed-control-signal-producing circuit electrically connected to the mixed-signal-controlled oscillator circuit and the phase-frequency detector circuit for receiving the error signal to output the analog control signal and the digital control signal to the mixed-signal-controlled oscillator circuit.

In accordance with the present invention, the mixed-control-signal-producing circuit includes an analog-control-signal-producing circuit for receiving the error signal to output the analog control signal to the mixed-signal-controlled oscillator circuit, and a digital-control-signal-producing circuit for receiving the error signal to output the digital control signal to the mixed-signal-controlled oscillator circuit.

Preferably, the digital control signal is a digital control word and the analog control signal is an offset current. The error signal includes an UP signal and a DN signal which are used to identify three different states between the reference signal and the oscillating signal. These three different states are: (1) (UP, DN)=(0,0): the phases and the frequencies of the reference signal and the oscillating signal are synchronous; (2) (UP, DN)=(1,0): the phase of the reference signal leads that of the oscillating signal, so the oscillating frequency has to be increased to catch up with the reference signal; and (3) (UP, DN)=(0,1): the phase of the reference signal lags behind that of the oscillating signal, so the oscillating frequency has to be decreased to make the reference signal catch up with the oscillating signal.

Preferably, the mixed-signal-controlled phase-locked loop further includes a programmable frequency divider electrically connected to the mixed-signal-controlled oscillator circuit for dividing the oscillating signal, and a delay interpolation circuit electrically connected to the programmable frequency divider and the phase-frequency detector circuit for diminishing phase noises contained in the divided oscillating signal.

Preferably, the mixed-signal-controlled oscillator circuit includes a digital control word circuit electrically connected to the digital-control-signal-producing circuit for receiving the digital control word to control a digital control current source to output a digital control current in proportion to the digital control word, and a current-controlled oscillator electrically connected to the analog-control-signal-producing circuit for receiving the offset current and the digital control current to generate the oscillating signal.

In addition, the current-controlled oscillator is a circuit worked with a current mode of symmetric loads, preferably a 3×3 array oscillator.

According to the present invention, the analog-control-signal-producing circuit includes a charge pump circuit electrically connected to the phase-frequency detector circuit for charging and discharging electricity into a loop filter according to the error signal, a loop filter electrically connected to the charge pump circuit for outputting a voltage signal, and a voltage-to-current converter electrically connected to the loop filter and the mixed-signal-controlled oscillator circuit for converting the voltage signal into the offset current to be inputted into the offset input of the mixed-signal-controlled oscillator circuit.

In accordance with the present invention, the digital-control-signal-producing circuit includes a digital control signal generator electrically connected to the phase-frequency detector circuit for receiving the error signal to generate two specific digital signals, and a digital control word algorithm circuit electrically connected to the digital control signal generator for outputting the digital control word into a digital control word input of the mixed-signal-controlled oscillator circuit in response to the two specific digital signals.

Preferably, the two specific digital signals are a SUB signal and a BYPASS signal. When the SUB signal is received, the digital control word algorithm circuit increases/decreases a step size in the digital control word. When the BYPASS signal is received, the digital control word algorithm circuit is disabled from changing the digital control word.

According to the second aspect of the present invention, a method for controlling a phase-locked loop includes the steps of: (a) generating an oscillating signal having an oscillating frequency and a phase in response to a digital control signal and an analog control signal, (b) detecting the oscillating frequency and the phase of the oscillating signal, (c) comparing the phase and the oscillating frequency with that of a reference signal to generate an error signal, and (d) outputting the analog control signal and a digital control signal in response to the error signal to enable the phase-locked loop to be controlled.

Preferably, the digital control signal is a digital control word and the analog control signal is an offset current.

In accordance with the present invention, after step (a), the method further includes the steps of (a1) dividing the oscillating signal, and (a2) decreasing the phase noises in the divided oscillating signal.

In addition, step (c) further includes (c1) generating a voltage signal by charging and discharging electricity into the loop filter according to the error signal, and (c2) converting the voltage signal into the offset current.

In addition, step (d) further includes (d1) generating two specific digital signals in response to the error signal, and (d2) outputting the digital control word in response to the two specific digital signals.

The present invention may best be understood through the following description with reference to the accompanying drawings, in which:

DETAILED DESCRIPTION OF THE PREFERRED EMBODIMENTS

Figure 1:
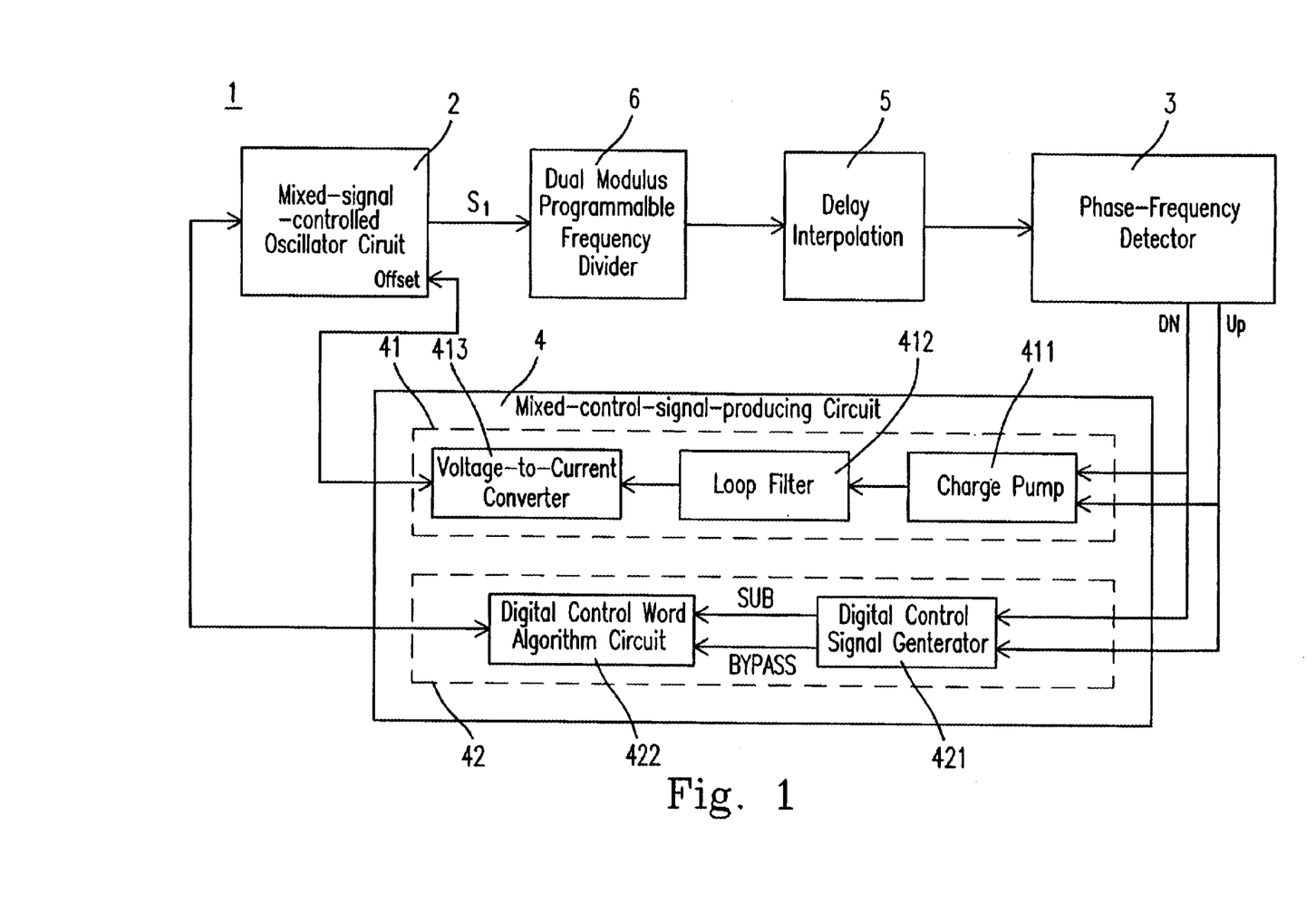
FIG. 1 schematically shows a preferred embodiment of the mixed-signal-controlled phase-locked loop according to the present invention.

Please refer to FIG. 1 showing a preferred embodiment of the mixed-signal-controlled phase-locked loop (PLL) 1 according to the present invention. The mixed-signal-controlled phase-locked loop 1 includes a mixed-signal-controlled oscillator circuit 2, a phase-frequency detector circuit 3, and a mixed-control-signal-producing circuit 4. Because this preferred embodiment of the mixed-signal-controlled PLL is designed to be used as a frequency synthesizer, a delay interpolation circuit 5 and a dual modulus programmable frequency divider 6 are added therein.

Figure 10:
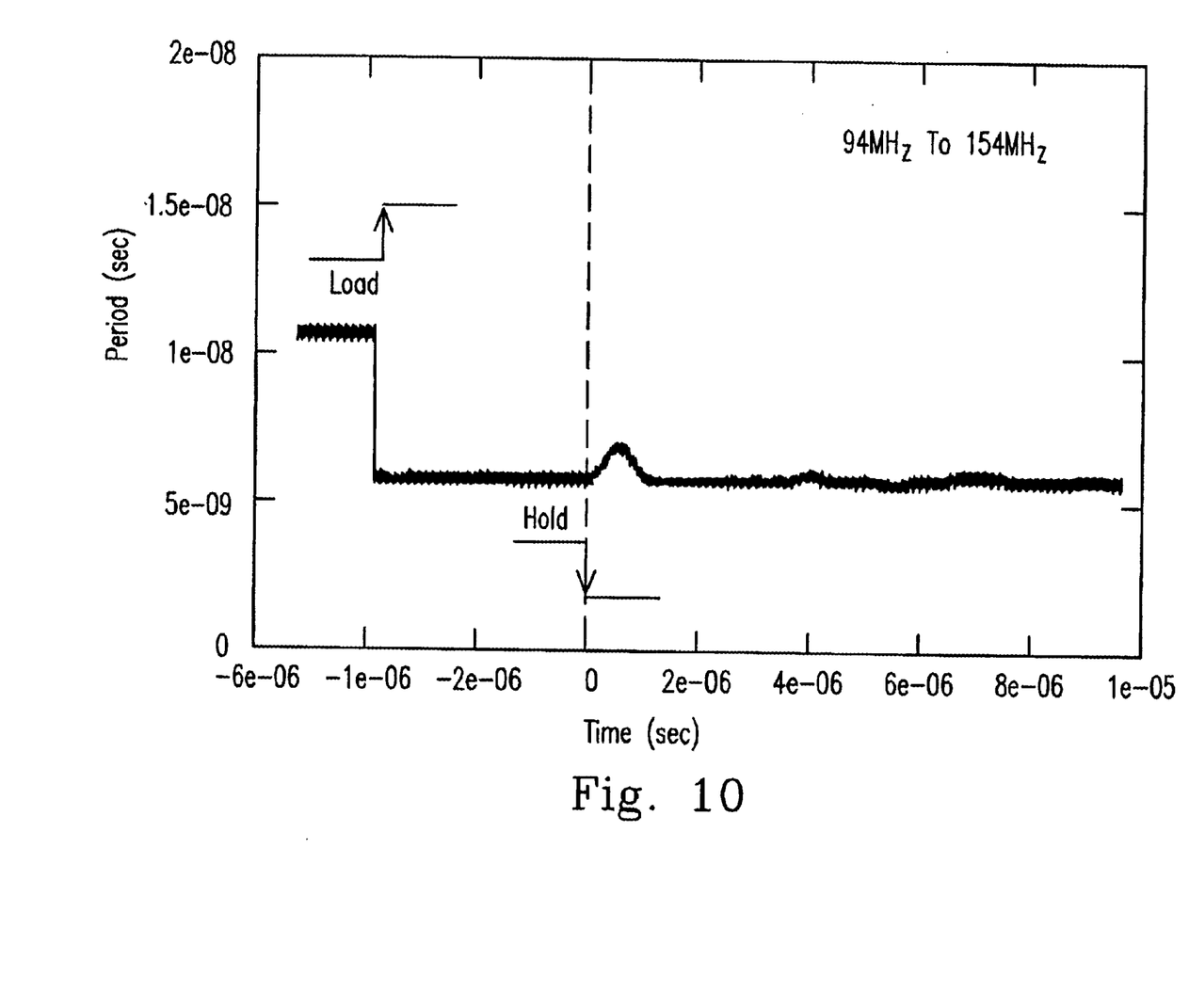
FIG. 10 is a diagram showing the transient response when the frequency of the integrated circuit in FIG. 8 is switched from 94 MHz to 154 MHz.

The mixed-signal-controlled PLL 1 of the present invention is designed to be used at a low voltage of 2 V to 3 V and to output a frequency ranged from 54 MHz to 154 MHz with a bandwidth of 1 MHz. In other words, 100 different frequencies are provided. If a frequency which has been used before is in use again, the same digital control signal can be reloaded. Therefore, the time for detecting the digital control signal of the frequency can be effectively saved (as shown in FIG. 10).

The mixed-control-signal-producing circuit 4 further includes an analog-control-signal-producing circuit 41 and a digital-control-signal-producing circuit 42. As shown in FIG. 1, the oscillating signal $S_1$ outputted from the mixed-signal-controlled oscillator circuit 2 is divided by the dual modulus programmable frequency divider 6 and is inputted into the phase-frequency detector circuit 3 through the delay interpolation circuit 5. The oscillating signal $S_1$ has a phase and an oscillating frequency. The phase and the oscillating frequency of the oscillating signal $S_1$ is detected by the phase-frequency detector circuit 3. After the phase and the oscillating frequency are detected, the phase-frequency detector circuit 3 compares the phase and the oscillating frequency with a reference signal $S_{ref}$ to generate an error signal $S_{error}$. The analog-control-signal-producing circuit 41 and the digital-control-signal-producing circuit 42 receive the error signal $S_{error}$ and output an analog control signal and a digital control signal to the mixed-signal-controlled oscillator circuit 2, respectively. In the preferred embodiment of the present invention, the digital control signal is a digital frequency control word and the analog control signal is an offset current.

Figure 2:
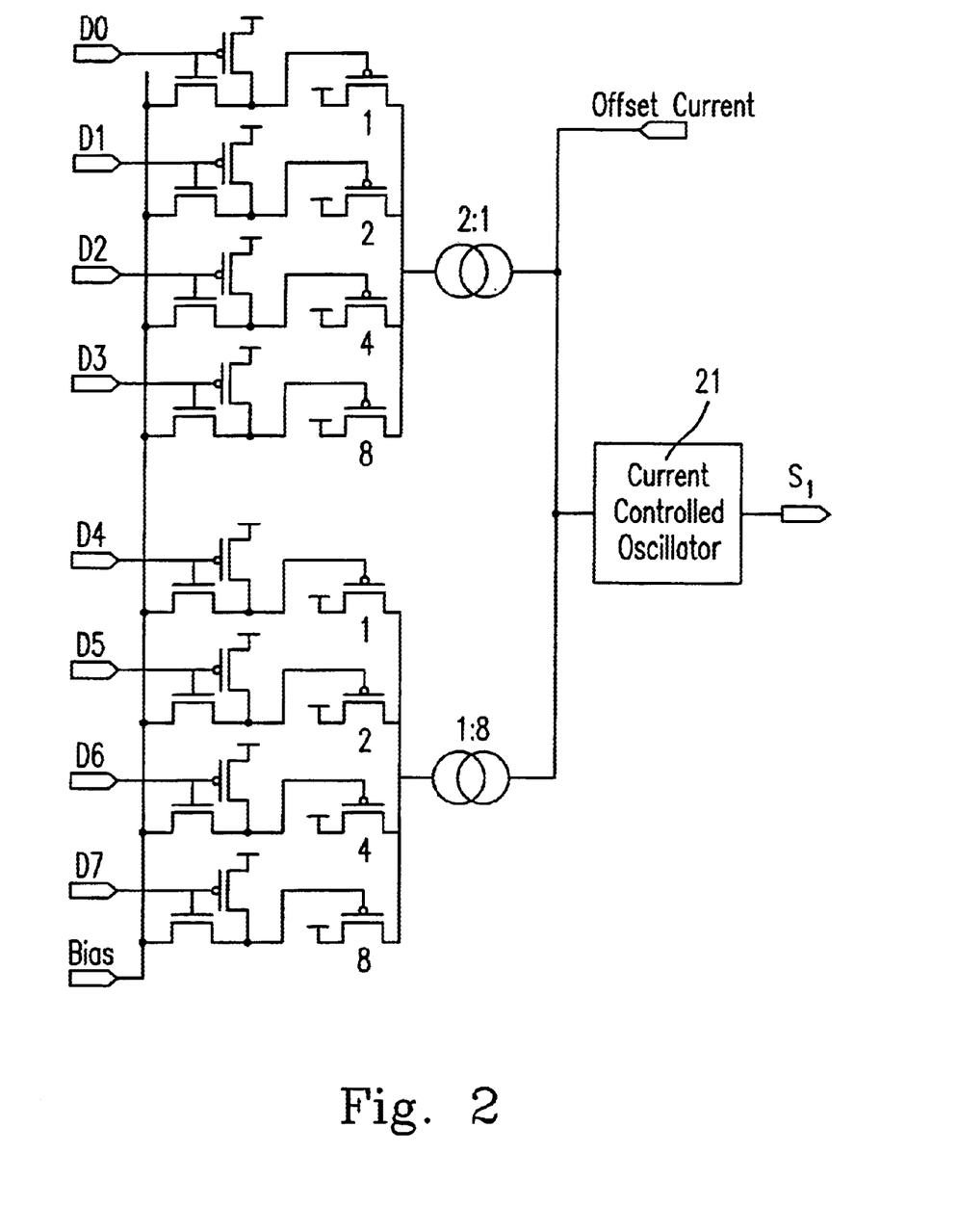
FIG. 2 is a circuitry of the mixed-signal-controlled oscillator according to the present invention.

The mixed-signal-controlled oscillator circuit 2 is the most important device in the mixed-signal-controlled PLL 1. This mixed-signal-controlled oscillator circuit 2 is very different from the traditional voltage controlled oscillator (VCO) circuit or the digital controlled oscillator (DCO) circuit. As shown in FIG. 2, the mixed-signal-controlled oscillator circuit 2 has an 8 bit digital control word circuit for receiving the digital control word to control a digital control current source and output a digital control current in proportion to the digital control word. In the meantime, the digital control current is added to the offset current to jointly control a current-controlled oscillator 21 to generate the oscillating signal $S_1$. Therefore, by presetting the digital frequency control word, the switching time in the oscillating frequency of the oscillating signal $S_1$ can be effectively reduced. On the other hand, the offset current produced by the analog-control-signal-producing circuit 41 can effectively increase the frequency resolution of the mixed-signal-controlled oscillator circuit 2.

Figure 3A:
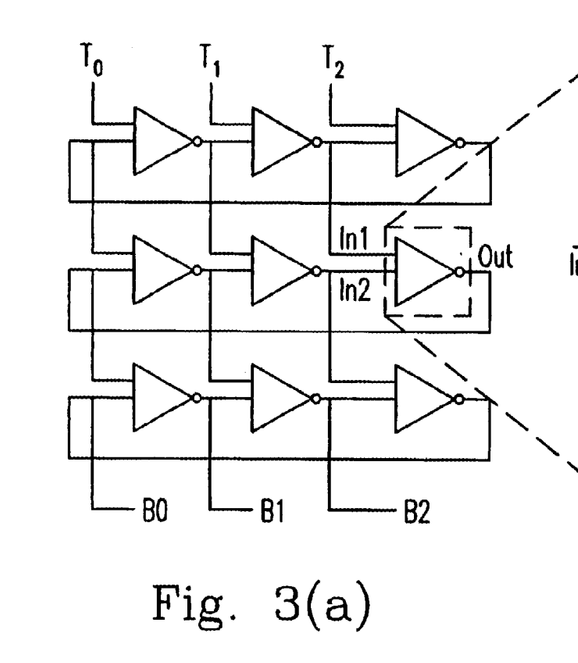
FIG. 3(a) is a circuitry of the 3×3 array current-controlled oscillator according to the present invention.
Figure 3B:
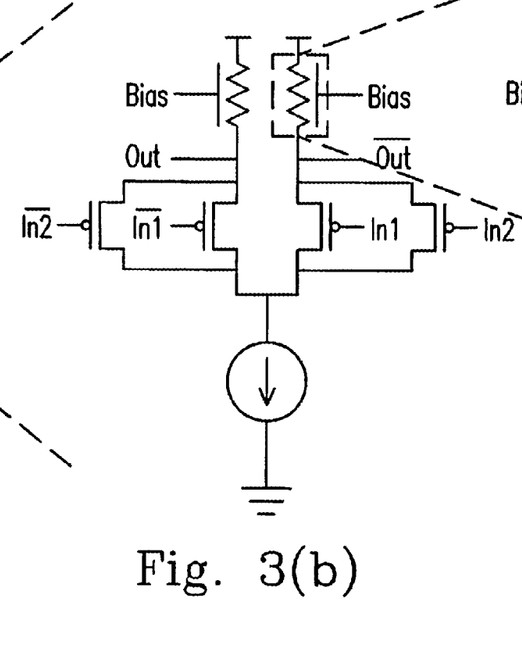
FIG. 3(b) is an enlarged diagram showing a differential inverter of the oscillator in FIG. 3(a) according to the present invention.
Figure 3C:
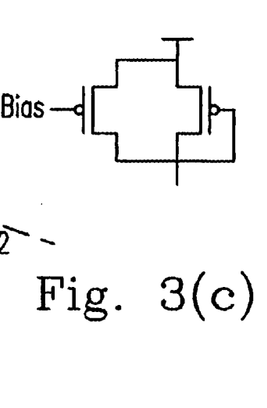
FIG. 3(c) is an enlarged diagram showing a symmetric load of the inverter in FIG. 3(b) according to the present invention.

Because the oscillator circuit 2 is controlled by mixed-mode signals, noise and crosstalk can be a serious problem. In order to eliminate the effect of noises, the circuit of the current-controlled oscillator 21 of the present invention is preferably designed to use a 3×3 array current-controlled oscillator shown in FIG. 3. The current-controlled oscillator is made up of 3×3 inverters and produces nine different output phases. The nodes at the top and bottom of the 3×3 array current-controlled oscillator are connected as $T_0$ to $B_2$, $T_1$ to $B_0$, and $T_2$ to $B_1$. Every inverter, as shown in FIG. 3(b), is preferably a symmetric-load differential inverter. Because the output phases are only based on the differences of the input signals, the differential inverter can have a lower noise. FIG. 3(c) is an enlarged diagram showing the symmetric load of the inverter in FIG. 3(b). Because the resistance is symmetric, the noise from the power supply can be eliminated to the first degree. Therefore, the frequency resolution can be further increased.

The oscillating signal $S_1$ outputted from the mixed-signal-controlled oscillator circuit 2 is inputted into the dual modulus programmable frequency divider 6. The divider 6 is the device having the highest working frequency in the mixed-signal-controlled PLL 1. In order to work at a high speed under a low voltage, a true single phase clock (TSPC) circuit is used as a register. As an example, take the high-speed register and construct a divider with an integer divisor from five to seventeen. After each of the nine phases of the oscillating signal $S_1$ are divided by nine dividers 6 respectively, the delay interpolation circuit 5 will combine from the nine phase-shifted frequency-divided signals to produce a new frequency-divided oscillating signal with a divisor ranging from 54/9 to 154/9 with increment of 1/9. Therefore, if the frequency of the reference signal $S_{ref}$ is 9 MHz, a synthesized signal with frequency from 54 MHz to 154 MHz can be outputted. This design has the advantage that the acquisition speed of the whole PLL 1 can be effectively increased since the frequency of the reference signal $S_{ref}$ is increased when compared to the case that an integer-divisor frequency divider is used.

Figure 4A:
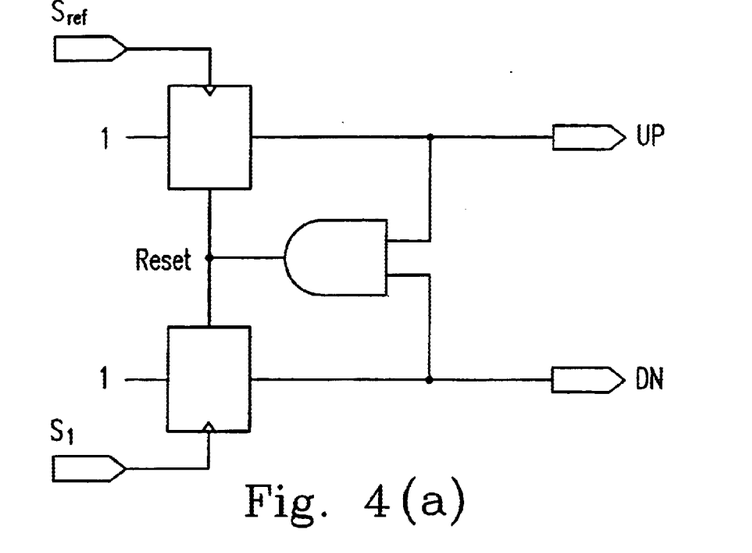
FIG. 4(a) is a circuitry of the tri-state phase-frequency detector circuit according to the present invention.

The error signal $S_{error}$ of the present invention includes an UP signal and a DN signal. The UP and DN signals are used to identify three different states between the reference signal and the oscillating signal $S_1$. The circuitry of the tri-state phase-frequency detector circuit 3 is shown in FIG. 4(a) and the three states. These states includes:

(1) (UP, DN)=(0,0) wherein the reference signal $S_{ref}$ and the oscillating signal $S_1$ are synchronous;

(2) (UP, DN)=(1,0) wherein the phase of the reference signal $S_{ref}$ leads that of the oscillating signal $S_1$, so the oscillating frequency has to be increased to catch up the reference signal $S_{ref}$; and (3) (UP, DN)=(0,1) wherein the phase of the reference signal $S_{ref}$ is lagging behind that of the oscillating signal $S_1$, so the oscillating frequency has to be decreased to make the reference signal $S_{ref}$ catch up the oscillating signal $S_1$.

Figure 4B:
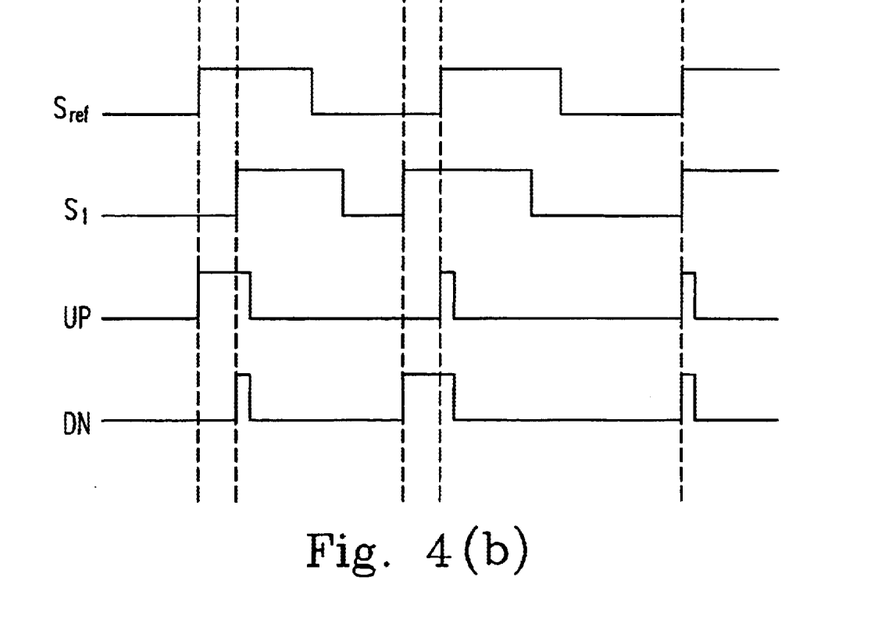
FIG. 4(b) is a signal waveform diagram showing the two signals generated by the phase frequency detector according to the present invention.

Because the UP and DN signals are processed by an AND gate and the output result is used to reset two registers, a short DN pulse is still produced when the phase of the reference signal $S_{ref}$ leads that of the oscillating signal $S_1$ (as shown in FIG. 4(b)). Similarly, a short UP pulse is still produced when the phase of the reference signal $S_{ref}$ lags behind that of the oscillating signal $S_1$. Even when the reference signal $S_{ref}$ and the oscillating signal $S_1$ are synchronous, short UP and DN pulses are still produced. However, this short pulses will not cause any effect on the PLL 1. By using this phase-frequency detector circuit 3, the differences between the reference signal $S_{ref}$ and the oscillating signal $S_1$ can be precisely obtained. At the same time, the UP and DN signals are outputted into the analog and digital-control-signal-producing circuits 41 and 42 for outputting the offset current and the digital control word respectively.

Figure 5:
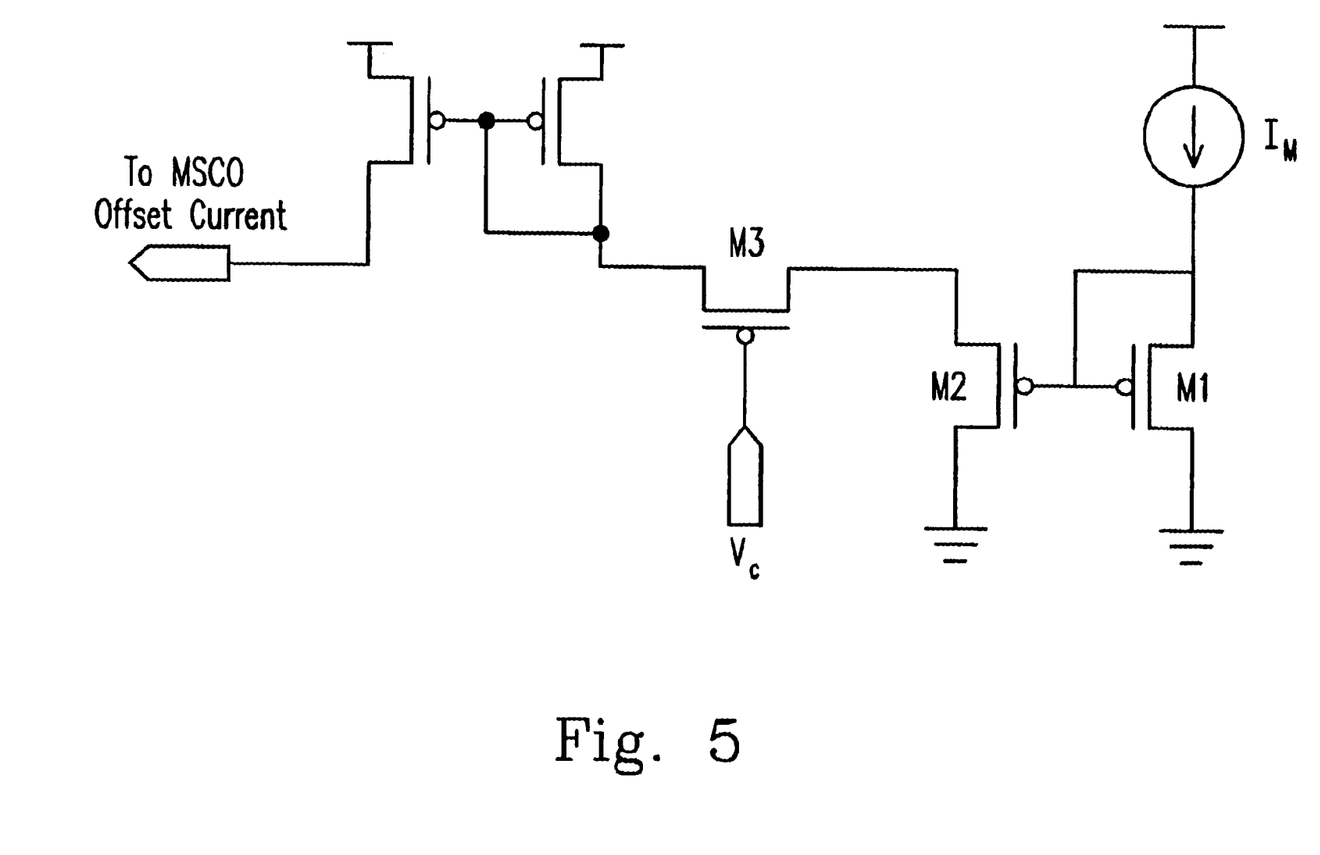
FIG. 5 is a circuitry of the voltage-to-current converter according to the present invention.

The analog-control-signal-producing circuit 41 includes a charge pump circuit 411, a loop filter 412, and a voltage-to-current converter 413. The UP and DN signals directly control the charge pump circuit 411 to charge and discharge electricity into the loop filter. The quantity of electricity charged and discharged by the charge pump circuit 411 is dependent on the length of the UP and DN signals. Therefore, a voltage signal outputted from the loop filter 412 can be precisely controlled. The parameters of the loop filter 412 is very important to the loop bandwidth and the damping characteristics of the PLL 1. Because the digital-control-signal-producing circuit 42 improves the speed of frequency acquisition, a smaller loop bandwidth and a proper damping value can be used to increase the stability of the voltage signal. Thereafter, the voltage-to-current converter 413 electrically connected to the loop filter 412 and the mixed-signal-controlled oscillator circuit 2 converts the voltage signal into the offset current to be inputted into the offset input of the mixed-signal-controlled oscillator circuit 2. As shown in FIG. 5, the voltage-to-current converter 413 according to the present invention includes a transistor $M_3$ having a variable resistance. The drain of the transistor $M_3$ is connected to a current mirror so that the current will be the same as a current of a constant current source $I_M$. Therefore, the offset current can be indicated by $KI_M$, where K is a constant between one and zero and is continuously controlled by an analog control voltage Vc. Because the offset current is a continuous function of the analog control voltage Vc, the resolution of the frequency control can be effectively increased.

Figure 6:
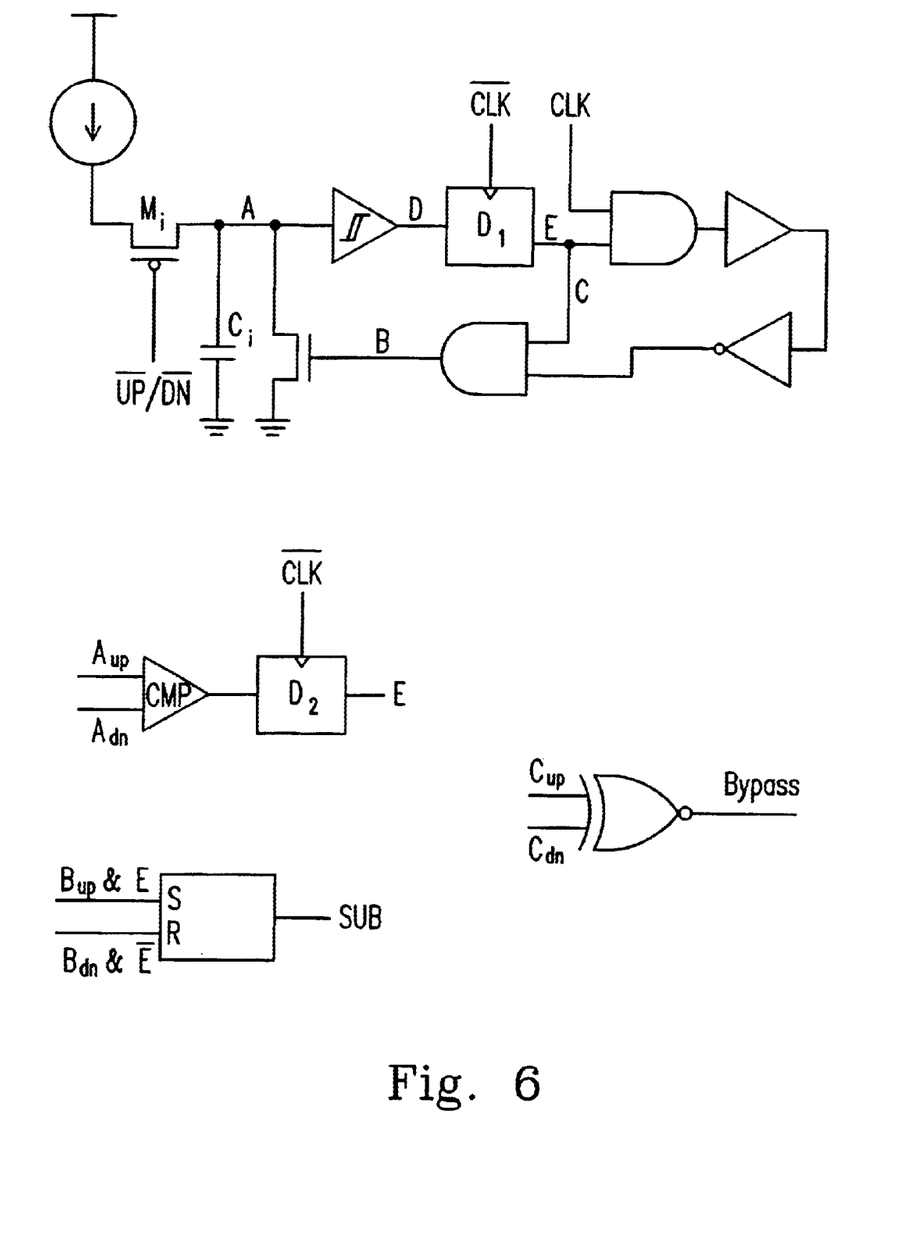
FIG. 6 is a circuitry of the digital control signal generator according to the present invention.

The digital-control-signal-producing circuit 42 includes a digital control signal generator 421 and a digital control word algorithm circuit 422. Because the UP and DN signals are a series of pulses, they are not suitable to be directly used by the digital circuit 42. Therefore, the digital control signal generator 421 is used for receiving the UP and DN signals to generate digital signals. FIG. 6 is a circuitry showing the preferred embodiment of the digital control signal generator 421 according to the present invention. As shown in FIG. 6, the digital control signal generator 421 includes two integrators and a comparing circuit. If an UP signal is received, the transistor Mi will be conducted and the capacitor Ci will receive a current. The voltage at the node A will be increased. When the voltage at the node A is higher than the threshold voltage of the Schmitt trigger, the voltage at the node D will be increased. A register $D_1$ which is triggered by the reference signal $S_{ref}$ will cause the outputs to be synchronous with the digital circuit 42. Then, by some logic methods, the capacitor Ci will be discharged and the integration of the UP and DN signal will be started again. Even the difference between the UP and DN signals is very small, it can still be integrated to a large enough value for modifying the digital frequency control word.

By comparing the voltages at the node A of the UP and DN parts, it is easy to distinguish whether the phase of the reference signal $S_{ref}$ is lagging behind or leads that of the oscillating signal $S_1$. Through a register $D_2$ which is triggered by the reference signal $S_{ref}$, a SUB signal which is synchronous with the digital circuit 42 will be outputted. The digital control word algorithm circuit 422 will increase or decrease the digital control word in response to the SUB signal. If one of the two signals at node C is logic HIGH, the BYPASS signal will not be outputted and the digital control word algorithm circuit 422 will increase or decrease the digital control word. If the two signals at nodes C of the UP and DN parts are both logic LOW, the phase difference between the reference signal $S_{ref}$ and the oscillating signal $S_1$ is small and the digital control word does not have to be modified. Therefore, a BYPASS signal is outputted. On the other and, when the reference signal $S_{ref}$ and the oscillating signal $S_1$ are synchronous, the traditional tri-state phase frequency detector still outputs some UP and DN pulses and the two signals at nodes C may both be HIGH. Therefore, an XNOR gate is added in the digital circuit 42 to generate the BYPASS signal.

Figure 7:
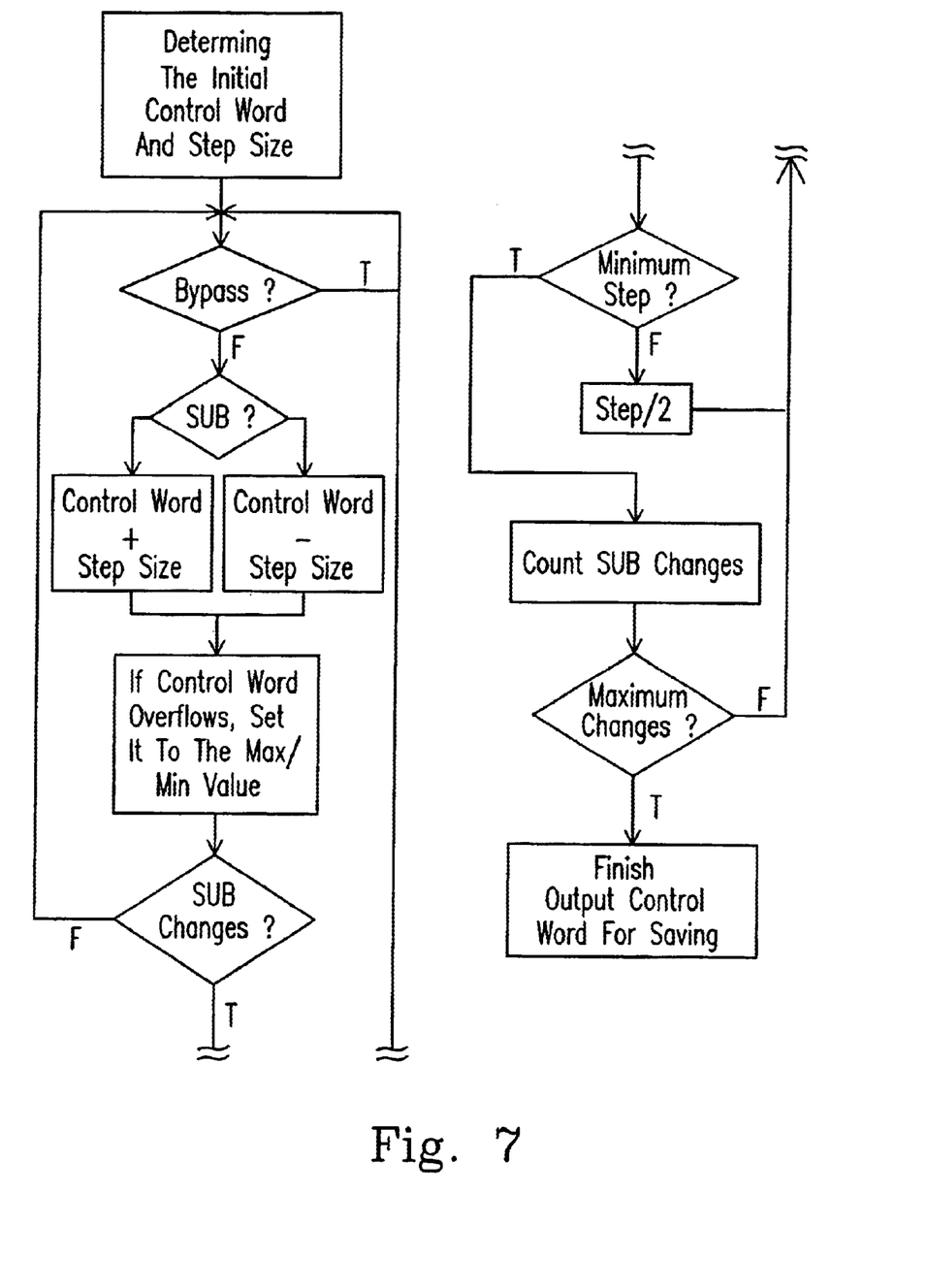
FIG. 7 is a flowchart showing the processes of the digital control word algorithm according to the present invention.

FIG. 7 is a flowchart showing the detailed algorithm of the digital control word algorithm circuit 422 according to the present invention. At first, the digital frequency control word and the step size are initialized. The SUB signal indicates that the digital frequency control word should be adjusted and the polarity of this adjustment, while the BYPASS signal indicates that the digital frequency control word does not have to be modified. When the SUB signal is logic HIGH, the digital frequency control word should be decreased by the step size. Contrarily, if the SUB signal is logic LOW, the digital frequency control word should be increased by the step size. If the digital frequency control word overflows/underflows, the digital frequency control word will be set to the maximum/minimum, respectively. When the SUB signal or the polarity of adjustment is reversed, the step size will be halved until the minimum step size is reached. Then, the digital frequency control word is modified by the minimum step size. After a pre-determined number of alternations in adjustment polarity, the digital control word searching algorithm is deemed to have converged and the final digital frequency control word is obtained. This correct digital frequency control word can be stored and reloaded to the frequency control word when necessary (e.g., when the same frequency is to be synthesized). Therefore, the acquisition time of the frequency-synthesizing PLL 1 during frequency switching can be dramatically reduced.

Figure 8:
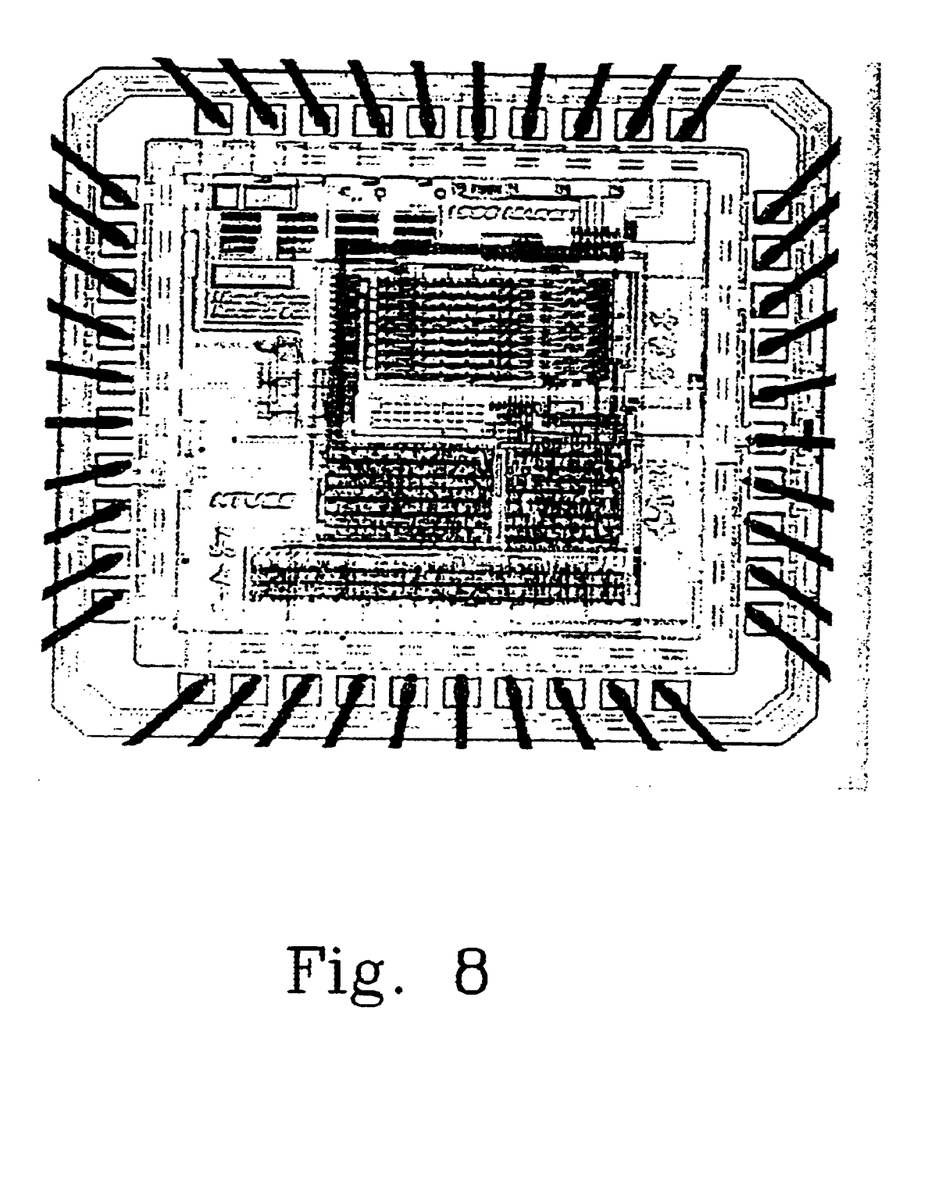
FIG. 8 shows a PLL frequency synthesizer integrated circuit, which is a preferred embodiment of a chip according to the present invention.
Figure 9:
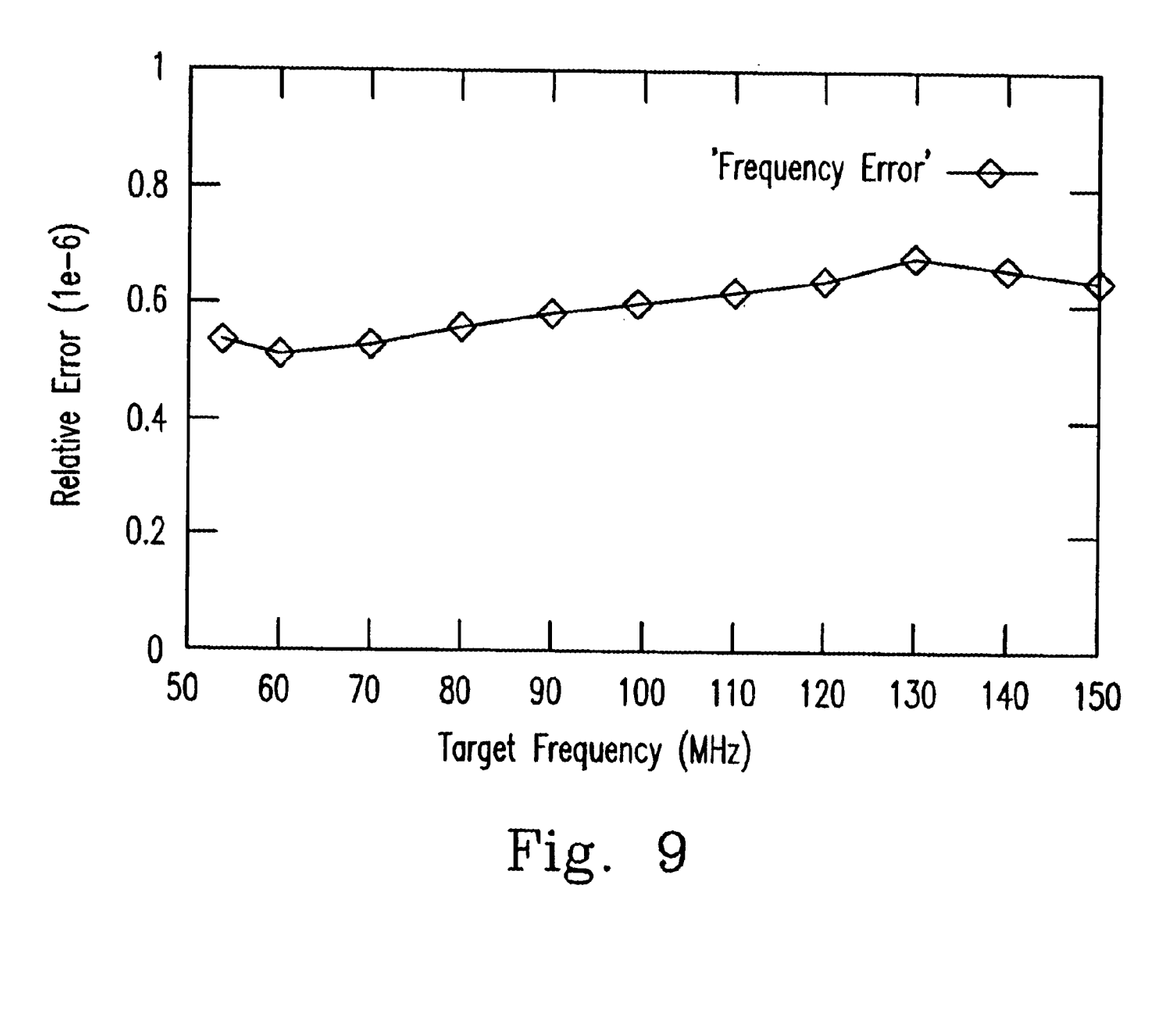
FIG. 9 is a diagram showing the relative frequency error of the integrated circuit in FIG. 8 at different target frequencies.
Figure 11A:
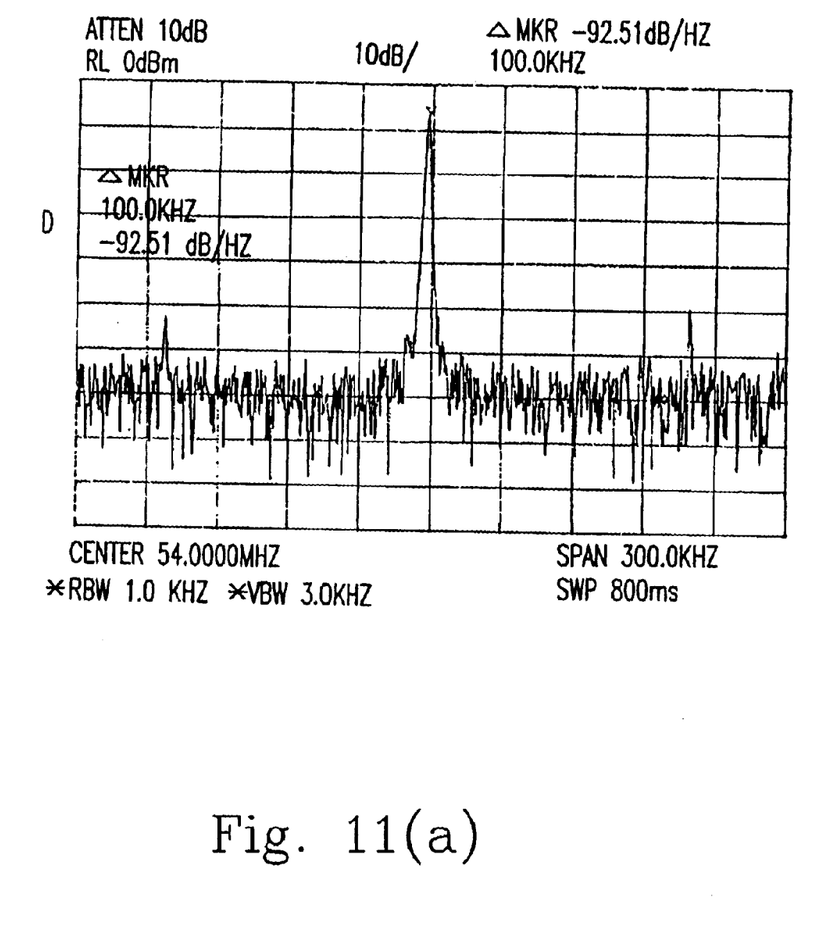
FIG. 11(a) is a diagram showing the stable-state phase noise of the output signal of the integrated circuit in FIG. 8.
Figure 11B:
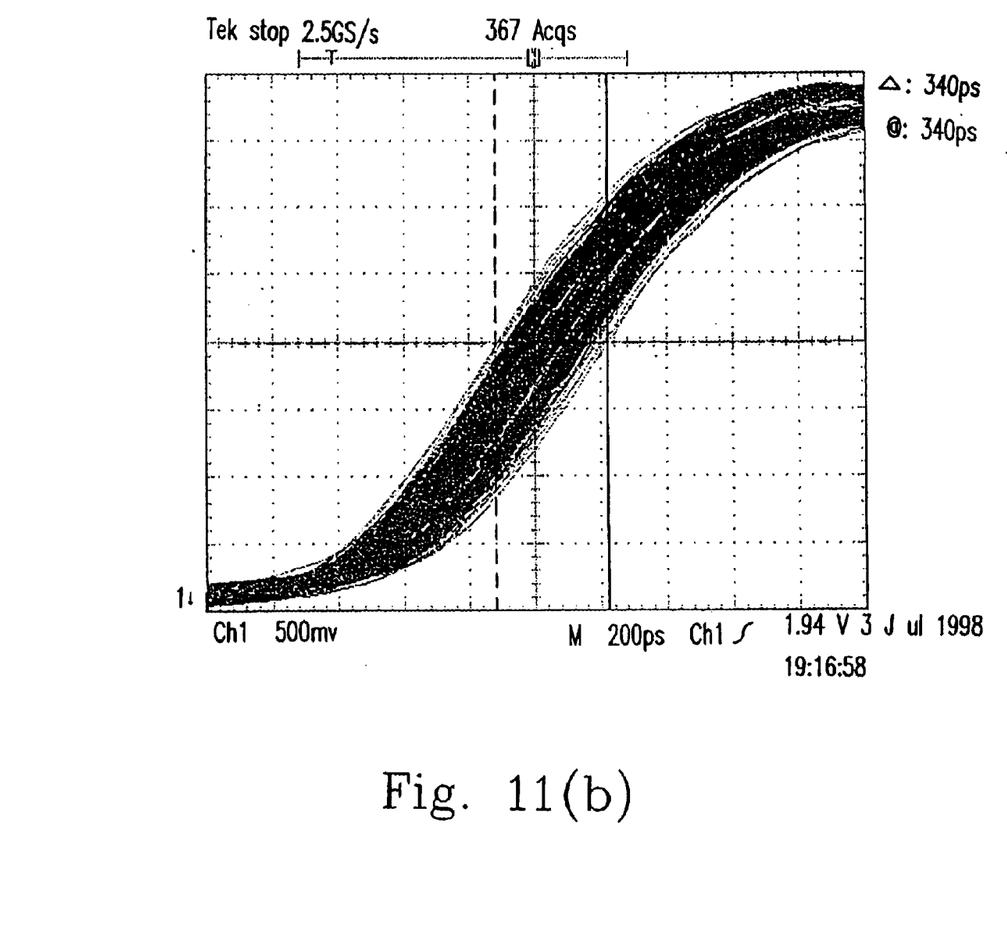
FIG. 11(b) is a diagram showing the jitter behavior of the synthesized output signal of the integrated circuit in FIG. 8.

An integrated circuit which is designed according to the method of the present invention working as a frequency synthesizer PLL is shown in FIG. 8. The relative frequency errors of the frequency synthsizer at different target frequencies are plotted in FIG. 9. The accuracy of this circuit is very high and the average error is less than 1 ppm. The frequency switching speed is also very fast, as shown in FIG. 10. When the frequency is switched from 94 MHz to 154 MHz, the circuit becomes stable in two micro-seconds. FIG. 11(a) and FIG. 11(b) are diagrams showing the stable-state phase noise and jitter behavior of the frequency synthesizer integrated circuit according to the present invention, which are also very good.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

We claim:

1. A mixed-signal-controlled phase-locked loop comprising:

a mixed-signal-controlled oscillator circuit for generating an oscillating signal having an oscillating frequency and a phase in response to a digital control signal and an analog control signal, wherein said digital control signal is a digital control word and said analog control signal is an offset current;

a phase-frequency detector circuit electrically connected to said mixed-signal-controlled oscillator circuit, detecting said phase and said oscillating frequency of said oscillating signal and comparing said phase and said oscillating frequency with that of a reference signal to generate an error signal after said phase and oscillating frequency are detected; and a mixed-control-signal-producing circuit electrically connected to said mixed-signal-controlled oscillator circuit and said phase-frequency detector circuit for receiving a number of said error signal and a length of said error signal to output said analog control signal and said digital control signal to said mixed-signal-controlled oscillator circuit, wherein said mixed-control-signal-producing circuit comprises:

an analog-control-signal-producing circuit electrically connected to said mixed-signal-controlled oscillator circuit and said phase-frequency detector circuit for receiving said error signal to output said analog control signal to said mixed-signal-controlled oscillator circuit; and a digital control-signal-producing circuit electrically connected to said mixed-signal-controlled oscillator circuit and said phase-frequency detector circuit for receiving said error signal to output said digital control signal to said mixed-signal-controlled oscillator circuit, wherein said digital-control-signal-producing circuit comprises:

a digital control signal generator electrically connected to said phase-frequency detector circuit for receiving said error signal to generate two specific digital signals; and a digital control word algorithm circuit electrically connected to said digital control signal generator for outputting said digital control word into a digital control word input of said mixed-signal-controlled oscillator circuit in response to said two specific digital signals, wherein said two specific digital signals are a SUB signal and a BYPASS signal, wherein said digital control word algorithm circuit is prohibited to increase/decrease said digital control word when said BYPASS signal is received, wherein said mixed-signal-controlled oscillator circuit comprises:

a digital control word circuit electrically connected to said digital-control-signal-producing circuit for receiving said digital control word to control a digital control current source to output a digital control current in proportion to said digital control word; and a current-controlled oscillator electrically connected to said analog-control-signal-producing circuit for receiving said offset current and said digital control current to generate said oscillating signal, wherein said current-controlled oscillator is a 3×3 array oscillator with nine inverters, wherein said inverters are current-mode differential inverters with symmetric loads.

2. The loop according to claim 1, wherein said error signal includes an UP signal and a DN signal which are used to identify three different states between said reference signal and said oscillating signal.

3. The loop according to claim 2, wherein said three different states include:

(UP, DN)=(0,0) wherein said phases and said frequencies of said reference signal and said oscillating signal are synchronous;

(UP, DN)=(1,0) wherein said phase of said reference signal leads that of said oscillating signal, so said oscillating frequency has to be increased to catch up with said reference signal; and (UP, DN)=(0,1) wherein said phase of said reference signal is lagging behind that of said oscillating signal, so said oscillating frequency has to be decreased to make said reference signal catch up with said oscillating signal.

4. The loop according to claim 1, further comprising:

a programmable frequency divider electrically connected to said mixed-signal-controlled oscillator circuit for dividing said oscillating signal; and a delay interpolation circuit electrically connected to said programmable frequency divider and said phase-frequency detector circuit for interpolating said frequency-divided oscillating signals.

5. The loop according to claim 1, wherein said analog-control-signal-producing circuit comprises:

a charge pump circuit electrically connected to said phase-frequency detector circuit for charging and discharging electricity into a loop filter according to said error signal;

said loop filter electrically connected to said charge pulp circuit for outputting a voltage signal; and a voltage-to-current converter electrically connected to said loop filter and said mixed-signal-controlled oscillator circuit for converting said voltage signal into said offset current to be inputted into said offset input of said mixed-signal-controlled oscillator circuit.

6. The loop according to claim 1, wherein said digital control word algorithm circuit increases/decreases a size of said digital control word when said SUB signal is received.

* * * * *